(12) United States Patent
Heck et al.

(10) Patent No.: US 7,324,350 B2
(45) Date of Patent: Jan. 29, 2008

(54) MEMS RF SWITCH MODULE INCLUDING A VERTICAL VIA

(75) Inventors: John M. Heck, Palo Alto, CA (US); Tsung-Kuan Allen Chou, San Jose, CA (US); Joseph S. Hayden, III, San Francisco, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/546,595

(22) Filed: Oct. 11, 2006

(65) Prior Publication Data

US 2007/0029659 A1 Feb. 8, 2007

Related U.S. Application Data

(62) Division of application No. 10/606,633, filed on Jun. 25, 2003, now Pat. No. 7,170,155.

(51) Int. Cl.
 *H05K 7/00* (2006.01)

(52) U.S. Cl. ............... 361/760; 361/781; 361/783; 174/253; 333/101; 333/105; 333/258; 333/259; 335/78

(58) Field of Classification Search ............ 361/760, 361/781, 783; 174/253; 333/101, 105, 258, 333/259; 335/78
See application file for complete search history.

(56) References Cited

U.S. PATENT DOCUMENTS

| | | | |
|---|---|---|---|
| 6,025,767 A * | 2/2000 | Kellam et al. ............... 335/128 |
| 6,195,047 B1 * | 2/2001 | Richards ............... 343/700 MS |
| 6,225,692 B1 * | 5/2001 | Hinds ........................ 257/698 |
| 6,384,353 B1 | 5/2002 | Huang et al. |
| 6,396,711 B1 | 5/2002 | Degani et al. |
| 6,426,484 B1 | 7/2002 | Hembree et al. |
| 6,509,816 B1 | 1/2003 | Staker et al. |
| 6,511,894 B2 | 1/2003 | Song |
| 6,538,312 B1 * | 3/2003 | Peterson et al. ............ 257/680 |
| 6,559,530 B2 | 5/2003 | Hinzel et al. |
| 6,624,003 B1 * | 9/2003 | Rice ........................... 438/106 |
| 6,639,493 B2 * | 10/2003 | Shen et al. ................... 335/78 |
| 6,673,697 B2 | 1/2004 | Ma et al. |
| 6,696,645 B2 * | 2/2004 | Margomenos et al. ...... 174/541 |
| 6,713,314 B2 | 3/2004 | Wong et al. |
| 6,798,315 B2 * | 9/2004 | Schaefer ..................... 333/105 |
| 6,836,194 B2 * | 12/2004 | Wheeler et al. ............. 333/105 |
| 6,852,926 B2 | 2/2005 | Ma et al. |
| 6,853,067 B1 | 2/2005 | Cohn et al. |
| 6,876,056 B2 | 4/2005 | Tilmans et al. |
| 6,891,239 B2 | 5/2005 | Anderson et al. |
| 6,900,773 B2 | 5/2005 | Poilasne et al. |

(Continued)

*Primary Examiner*—Tuan T. Dinh
*Assistant Examiner*—Hoa C Nguyen
(74) *Attorney, Agent, or Firm*—Blakely, Sokoloff, Taylor & Zafman LLP

(57) ABSTRACT

An apparatus and method to provide a micro-electromechanical systems (MEMS) radio frequency (RF) switch module with a vertical via. The MEMS RF switch module includes a MEMS die coupled to a cap section. The vertical via passes through the cap section to electrically couple an RF switch array of the MEMS die to a printed circuit board (PCB). In one embodiment, the MEMS die includes a trace ring surrounding at least a portion of the RF switch array so that a signal may enter or exit the MEMS RF switch module using the vertical via without crossing the trace ring.

3 Claims, 8 Drawing Sheets

U.S. PATENT DOCUMENTS

| | | |
|---|---|---|
| 6,903,452 B2 | 6/2005 | Ma et al. |
| 6,914,323 B2 | 7/2005 | Curtis et al. |
| 7,098,117 B2 * | 8/2006 | Najafi et al. ............... 438/456 |
| 2002/0000649 A1 | 1/2002 | Tilmans et al. |
| 2002/0075651 A1 * | 6/2002 | Newton et al. ............. 361/700 |
| 2003/0001251 A1 | 1/2003 | Cheever et al. |
| 2003/0020173 A1 * | 1/2003 | Huff et al. .................. 257/774 |
| 2003/0047799 A1 | 3/2003 | Cheever et al. |
| 2003/0122640 A1 * | 7/2003 | Deligianni et al. ........... 335/78 |
| 2004/0012464 A1 | 1/2004 | Ma et al. |
| 2004/0262645 A1 | 12/2004 | Huff et al. |
| 2005/0006738 A1 | 1/2005 | Schaper et al. |
| 2005/0024165 A1 | 2/2005 | Hsu |

* cited by examiner

MEMS RF SWITCH MODULE INCLUDING A VERTICAL VIA

CROSS-REFERENCE TO RELATED APPLICATIONS

This application is a divisional of U.S. patent application Ser. No. 10/606,633, filed Jun. 25, 2003, and claims priority thereto under the provisions of 35 U.S.C. § 120. The priority application is now U.S. Pat. No. 7,170,155.

BACKGROUND OF THE INVENTION

1. Field of the Invention

The present invention relates generally to micro-electro-mechanical systems (MEMS) and, more specifically, the present invention relates to a MEMS switch module including a vertical via.

2. Background Information

Micro-electromechanical systems (MEMS) devices have a wide variety of applications and are prevalent in commercial products. One type of MEMS device is a MEMS RF switch module. A typical MEMS RF switch module contains one or more MEMS switches arranged in an RF switch array. MEMS RF switch modules are ideal for wireless devices because of their low power characteristics and ability to operate in radio frequency ranges. MEMS RF switch modules are often found in cell phones, wireless computer networks, communication systems, and radar systems. In wireless devices, MEMS RF switch modules can be used as antenna switches, mode switches, and transmit/receive switches.

Typically, MEMS devices, such as MEMS RF switch modules, use electrical feed-throughs that emerge horizontally from the edges of the module. These horizontal feed-throughs allow electrical signals to enter and exit the module. However, horizontal feed-throughs increase the footprint size of the MEMS module. Additionally, routing signals horizontally often results in crossing signal lines. Also, horizontal feed-throughs affect electrical performance, such as insertion loss, because of the length of the signal paths.

BRIEF DESCRIPTION OF THE DRAWINGS

The present invention is illustrated by way of example and not limitation in the accompanying figures.

DETAILED DESCRIPTION

Methods and apparatuses to provide MEMS RF switch modules having vertical vias are disclosed. In the following description numerous specific details are set forth in order to provide a thorough understanding of the present invention. It will be apparent, however, to one having ordinary skill in the art that the specific detail need not be employed to practice the present invention. In other instances, well-known materials or methods have not been described in detail in order to avoid obscuring the present invention.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment. Furthermore, the particular features, structures or characteristics may be combined in any suitable manner in one or more embodiments. In addition, it is appreciated that the figures provided herewith are for explanation purposes to persons ordinarily skilled in the art and that the drawings are not necessarily drawn to scale.

Figure 1:
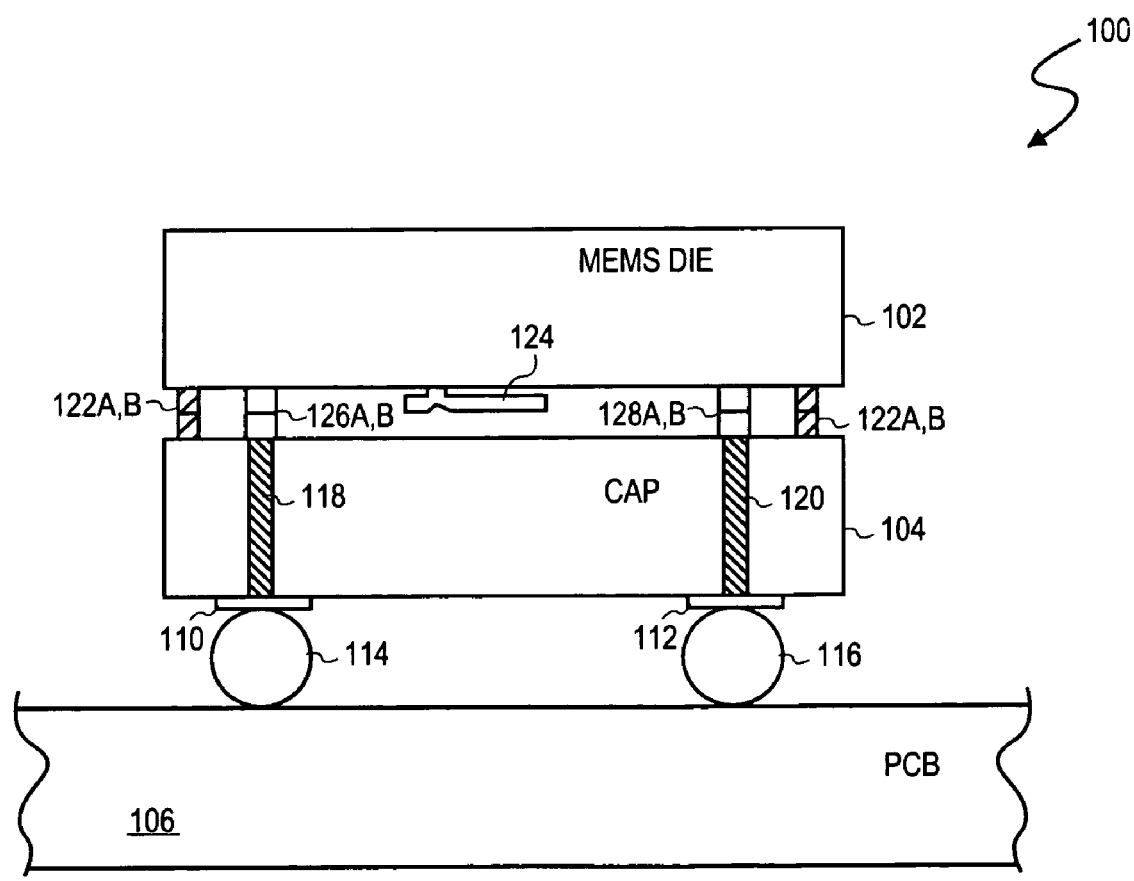
FIG. 1 is a cross-sectional view diagram illustrating one embodiment of a MEMS RF switch module in accordance with the teachings of the present invention.

Referring to FIG. 1, a MEMS RF switch module 100 in accordance with one embodiment of the present invention is shown. It will be understood that a MEMS module is also referred to as a MEMS package by one skilled in the art. A MEMS die 102 is coupled to a cap section 104. The MEMS die 102 includes an RF switch array 124. The RF switch array 124 includes at least one of, but is not limited to, a cantilever switch, a relay, or the like. The cap section 104 includes, but is not limited to, silicon, ceramic, glass, plastic, or the like.

The MEMS RF switch module 100 is coupled to printed circuit board (PCB) 106. Cap section 104 includes contacts 110 and 112 mounted to the bottom of the cap section 104. The contacts 110 and 112 are used to electrically and physically couple the MEMS RF switch module 100 to PCB 106 using various methods well known in the art. In the embodiment shown in FIG. 1, solder balls 114 and 116 are used to couple to the MEMS RF switch module 100 to PCB 106.

MEMS RF switch module 100 includes vias 118 and 120 that pass through the cap section 104 to electrically couple the MEMS die 102 to contacts 110 and 112, and subsequently to PCB 106. The vias 118 and 120 pass vertically through the cap section 104. The term "vertical" describes the vias 118 and 120 in relation to the mounting of the MEMS RF switch module 100 to PCB 106. The vias 118 and 120 allow signals to transit short distances between the RF switch array 124 and PCB 106. Also, while vias 118 and 120 are depicted in FIG. 1 as generally straight, they are not limited to this configuration.

In one embodiment, the vias 118 and 120 are electroplated with a metal conductor. In another embodiment using a ceramic cap section 104, the vias are metal filled. In this embodiment, the fabrication begins with a ceramic sheet, often called a "green sheet," that is punched with holes according to a pre-defined pattern. Metal paste is stencil printed to fill in the holes. The entire piece is heated and cleaned to produce metal filled vias.

Figure 2A:
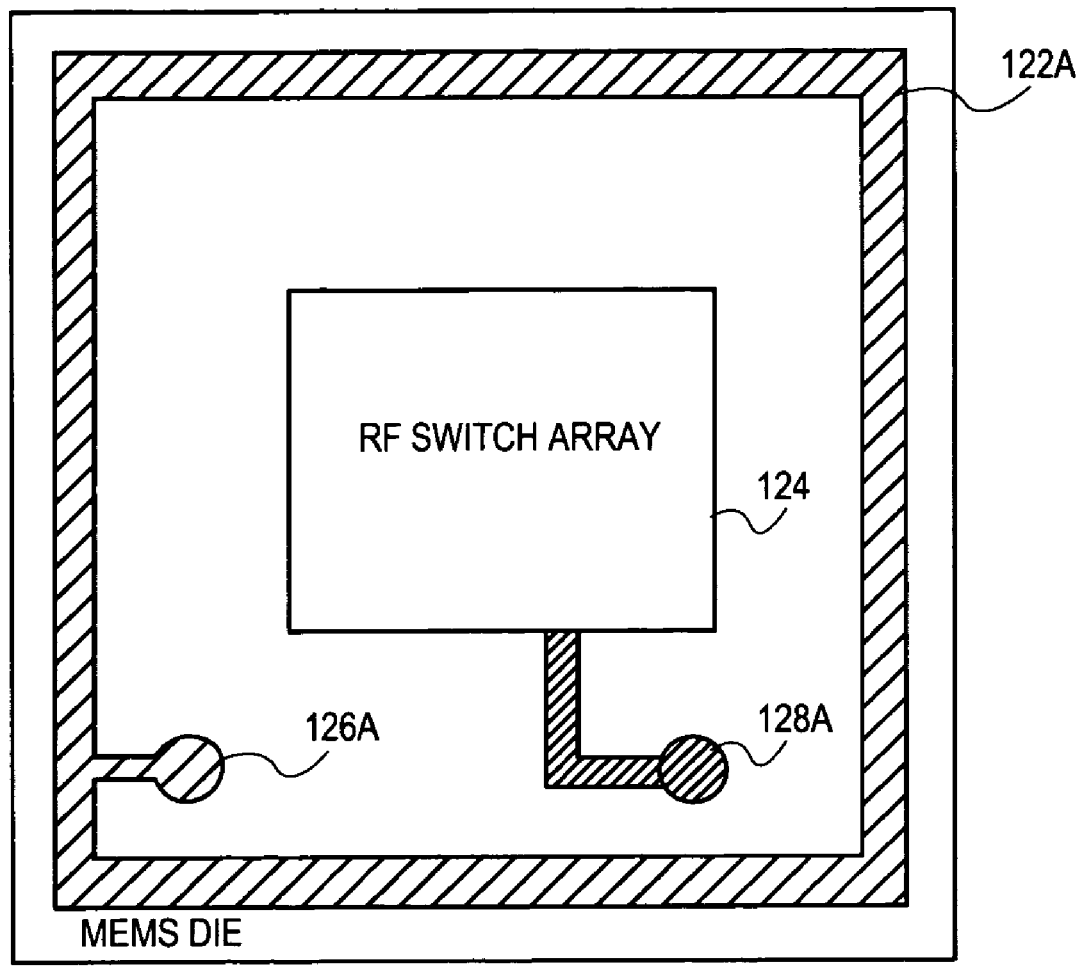
FIG. 2A is a top view diagram illustrating one embodiment of a MEMS die in accordance with the teachings of the present invention.
Figure 2B:
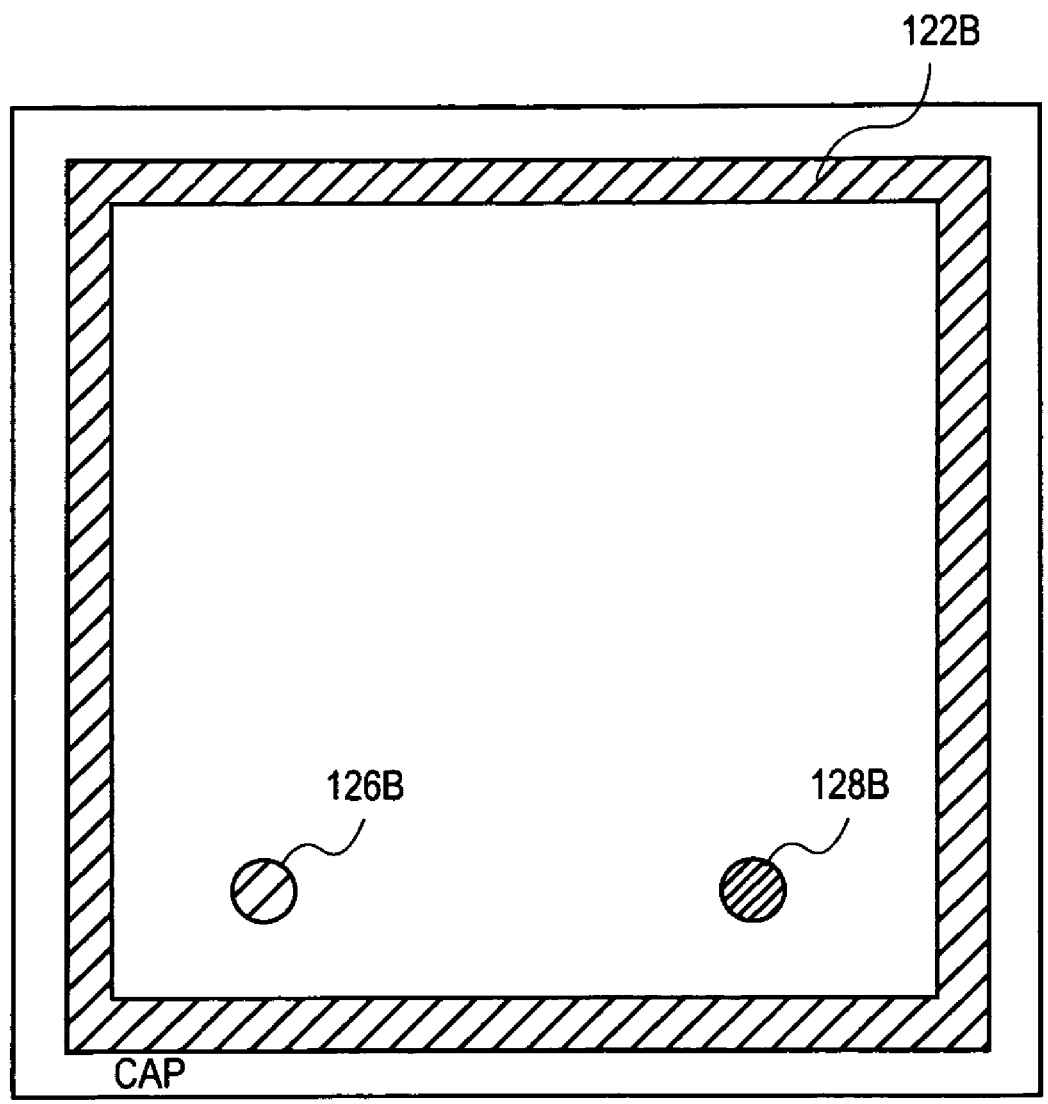
FIG. 2B is a top view diagram illustrating one embodiment of a cap section in accordance with the teachings of the present invention.

In the following discussion, reference will be made to FIGS. 2A and 2B in conjunction with FIG. 1. FIG. 2A shows a top view of MEMS die 102. FIG. 2B shows a top view of cap section 104.

MEMS die 102 includes a seal ring 122A and the cap section 104 includes a seal ring 122B. When the MEMS die 102 and the cap section 104 are coupled together, the seal rings 122A and 122B are pressed together to form a hermetical seal. The seal rings 122A and 122B can be sealed using solder, gold thermocompression bonding (TCB), gold thermosonic bonding (TSB), or the like. Thus, when the MEMS RF switch module 100 is sealed, the cavity around RF switch array 124 is sterile to reduce the affects of dust and other containments on the performance of the RF switch array 124. In one embodiment, the seal rings 122A and 122B are metal. In another embodiment, only one of MEMS die 102 or cap section 104 includes the seal ring prior to coupling MEMS die 102 and cap section 104 together.

FIGS. 1, 2A and 2B depict pads 126A, 126B, 128A, and 128B. Pads 126A and 126B electrically couple signals from the MEMS die 102 to contact 110 by way of via 118. Pads 128A and 128B electrically couple signals from the MEMS die 102 to contact 112 by way of via 120. In one embodiment, the pads 126A, 126B and 128A, 128B are physically coupled together using the same technique as utilized to couple the seal rings 122A, 122B. It will be understood that the invention is not limited to the design shown in FIGS. 1, 2A and 2B; in alternative embodiments, the MEMS RF switch module 100 may include other configurations of vias and pads.

A MEMS RF switch module with vertical vias offers several advantages. Feed-throughs that emerge vertically from the module reduce the form factors of the module. For example, MEMS RF switch modules with vertical vias have form factors in the range of 2×2 mm compared to form factors of 3×6 mm using conventional packaging schemes with horizontal feed-throughs. Also, the ability to route signals vertically from the module allows the route layout to be planar without any crossing signal lines. This simplifies the design and construction process of the MEMS module. Additionally, vertically routing signals on and off the module using vertical vias improves insertion loss since the signal paths are significantly shorter than typical horizontal routing schemes.

Figure 3A:
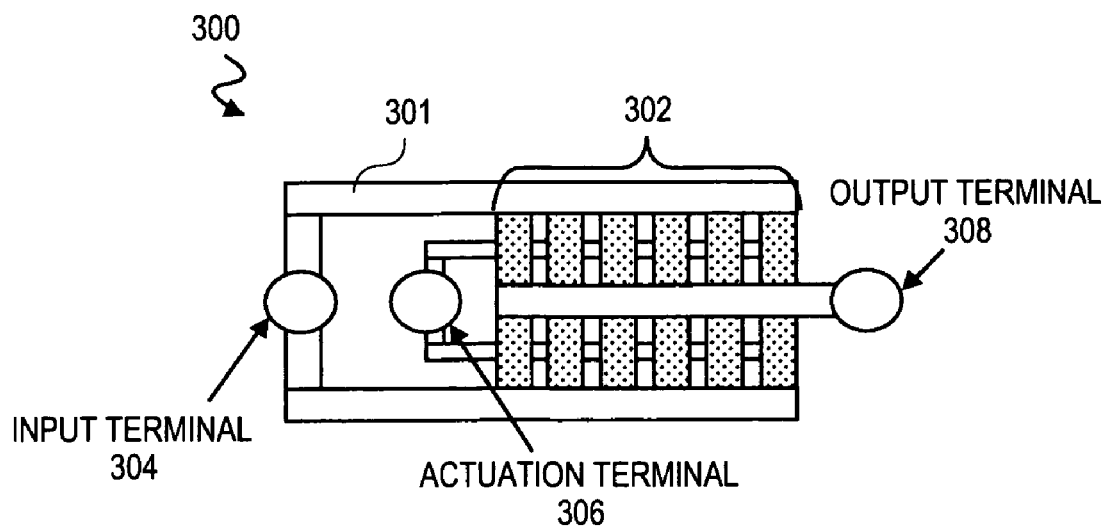
FIGS. 3A and 3B are top view diagrams illustrating alternative embodiments of MEMS RF switch modules in accordance with the teachings of the present invention.

FIGS. 3A-8 illustrate alternative embodiments of MEMS RF switch module configurations. Referring to FIGS. 3A and 3B, a top view diagram of a MEMS RF switch module 300 in accordance with one embodiment of the present invention is shown. An input terminal 304 is electrically coupled to the inputs of RF switch array 302. Output terminal 308 and actuation terminal 306 are electrically coupled to the outputs and actuation controls of RF switch array 302. The terminals 304, 306 and 308 are each electrically coupled to vias (not shown) that pass vertically through a cap section (not shown) to route signals vertically between the MEMS RF switch module 300 and a PCB (not shown.)

The MEMS RF switch module 300 also includes a trace ring 301. In one embodiment, trace ring 301 surrounds a portion of the RF switch array 302, while in another embodiment, the trace ring 301 surrounds the entire RF switch array 302. The input terminal 304 and the inputs of the switches of the RF switch array 302 are electrically coupled to the trace ring 301.

The vertical via scheme in conjunction with the trace ring 301 optimizes the performance of MEMS RF switch module 300. The vertical vias allow a signal to enter or to exit module 300 without crossing or "breaking" the trace ring 301. Eliminating the crossing of signal lines, such as RF signal lines, improves the electrical performance of the MEMS RF switch module 300. The vertical via design also shortens the signal path that a signal must transit between the RF switch array 302 and a PCB coupled to the MEMS switch module 300.

Figure 3B:
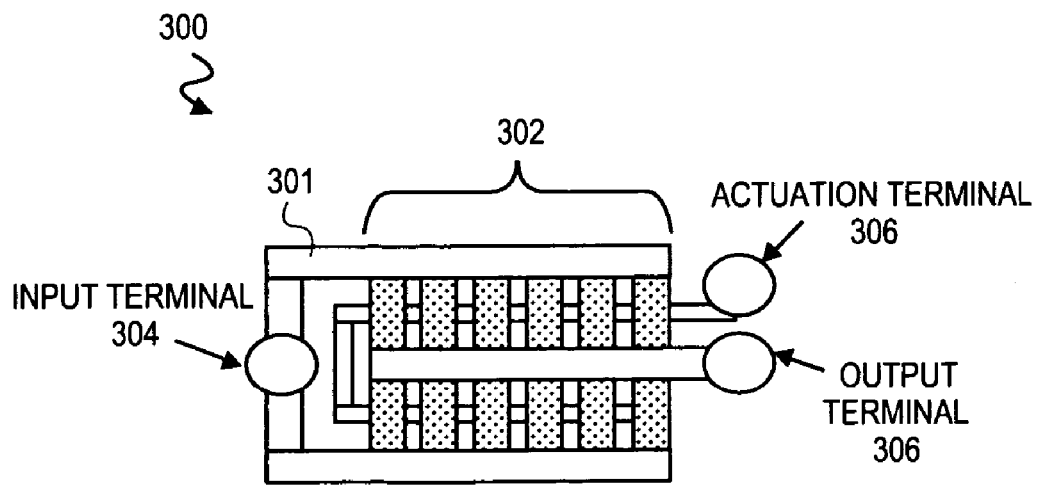

In FIGS. 3A and 3B, the input terminal 304 is electrically coupled to the trace ring 301. It will be understood that the MEMS RF switch module 300 is not limited to this configuration. On or more of the terminals 304, 306, and 308, or any combination thereof, may be electrically coupled to the trace ring 301. In FIG. 3A, the actuation terminal 306 is positioned near the input terminal 304; while in FIG. 3B, the actuation terminal 306 is positioned near output terminal 308. The vertical via scheme offers the flexibility to easily configure the electrical feed-throughs as needed for a particular design without the difficulty and performance losses associated with horizontal feed-throughs.

It will be understood that the terminals 304, 306, and 308 are electrically coupled to RF switch array 302 by multi-line routes. The terminals 304, 306, and 308 provide for signals to be routed to particular switches in the RF switch array 302. Thus, switches of the RF switch array 302 may be operated on an individual basis. For example, RF switch array 302 may include "series" switches to control the main RF signal and "shunt" switches to ground a receiver during the transmit time.

Figure 4:
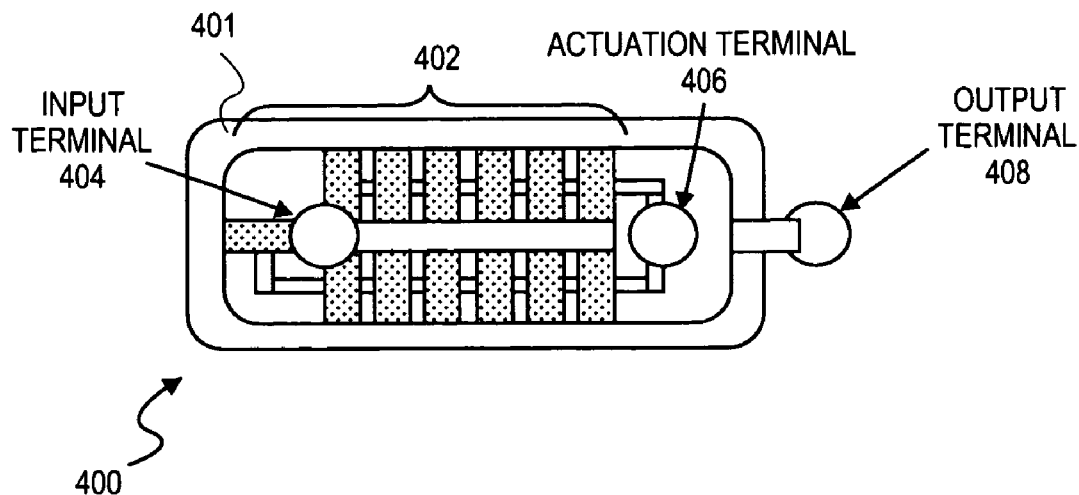
FIG. 4 is a top view diagram illustrating one embodiment of a MEMS RF switch module in accordance with the teachings of the present invention.

Referring to FIG. 4, a top view diagram of a MEMS RF switch module 400 in accordance with one embodiment of the present invention is shown. An input terminal 404, an output terminal 408, and an actuation terminal 406 are each electrically coupled to RF switch array 402. The terminals 404, 406, and 408 are each electrically coupled to vias (not shown) that pass vertically through a cap section (not shown) to route signals vertically between the module 400 and a PCB (not shown.) A trace ring 401 surrounds the RF switch array 402 and is electrically coupled to the outputs of the RF switch array 402 and the output terminal 408.

Figure 5:
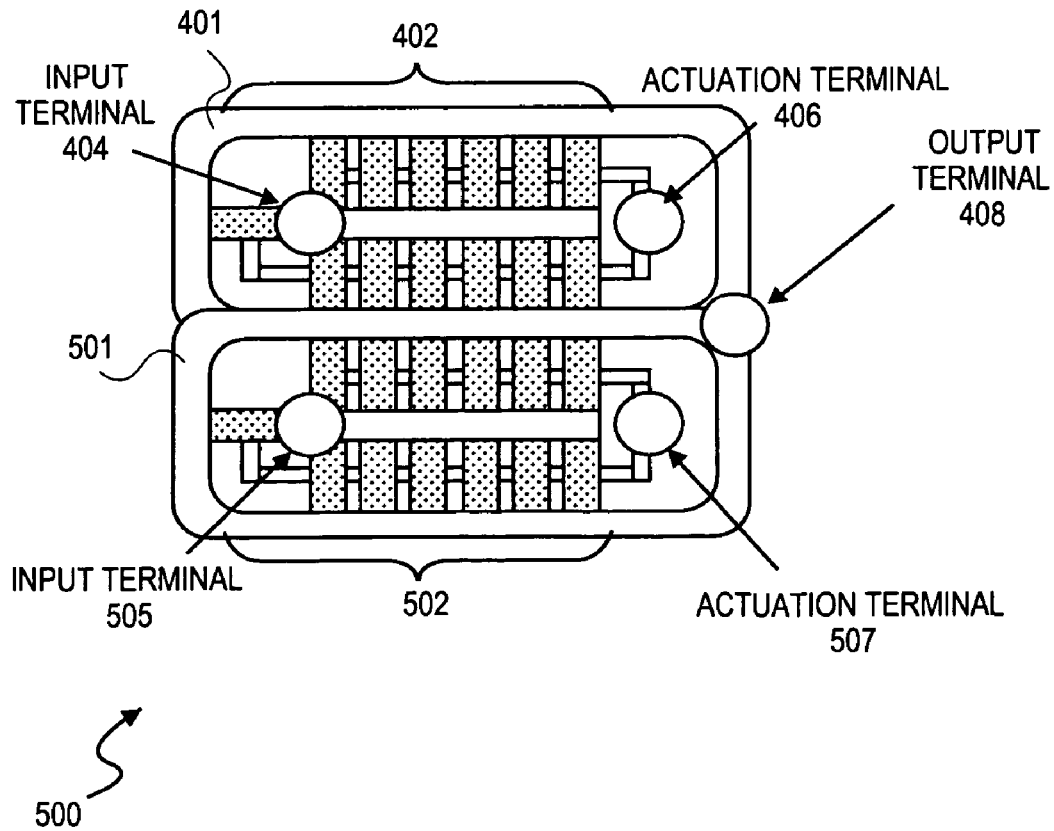
FIG. 5 is a top view diagram illustrating one embodiment of a MEMS RF switch module in accordance with the teachings of the present invention.

FIG. 5 is a top view diagram of a MEMS RF switch module 500 that is an alternative embodiment of MEMS RF switch module 400 described above. Module 500 adds to module 400 an input terminal 505 coupled to an RF switch array 502 and an actuation terminal 507 coupled to RF switch array 502. MEMS RF switch module 500 also includes a trace ring 501 surrounding the RF switch array 502 and electrically coupled to the outputs of the RF switch array 502 and output terminal 408.

Figure 6:
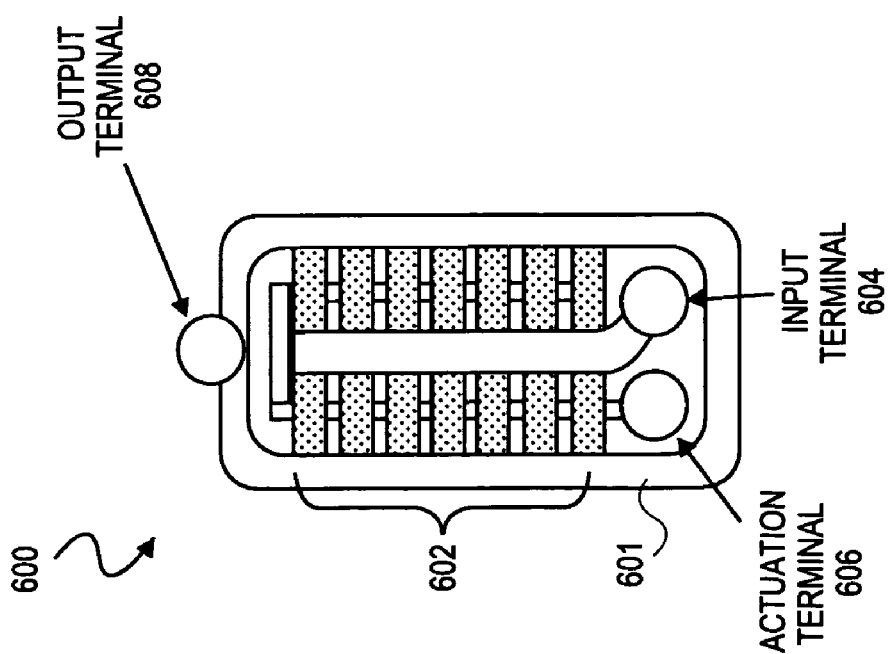
FIG. 6 is a top view diagram illustrating one embodiment of a MEMS RF switch module in accordance with the teachings of the present invention.

Referring to FIG. 6, a top view diagram of a MEMS RF switch module 600 in accordance with one embodiment of the present invention is shown. An input terminal 604 is electrically coupled to RF switch array 602. Output terminal 608 and actuation terminal 606 are each electrically coupled to the RF switch array 602. The terminals 604, 606 and 608 are each electrically coupled to vias (not shown) that pass vertically through a cap section (not shown) to route signals vertically between the module 600 and a PCB (not shown.) A trace ring 601 surrounds the RF switch array 602 and is electrically coupled to the outputs of the RF switch array 602 and output terminal 608.

Figure 7:
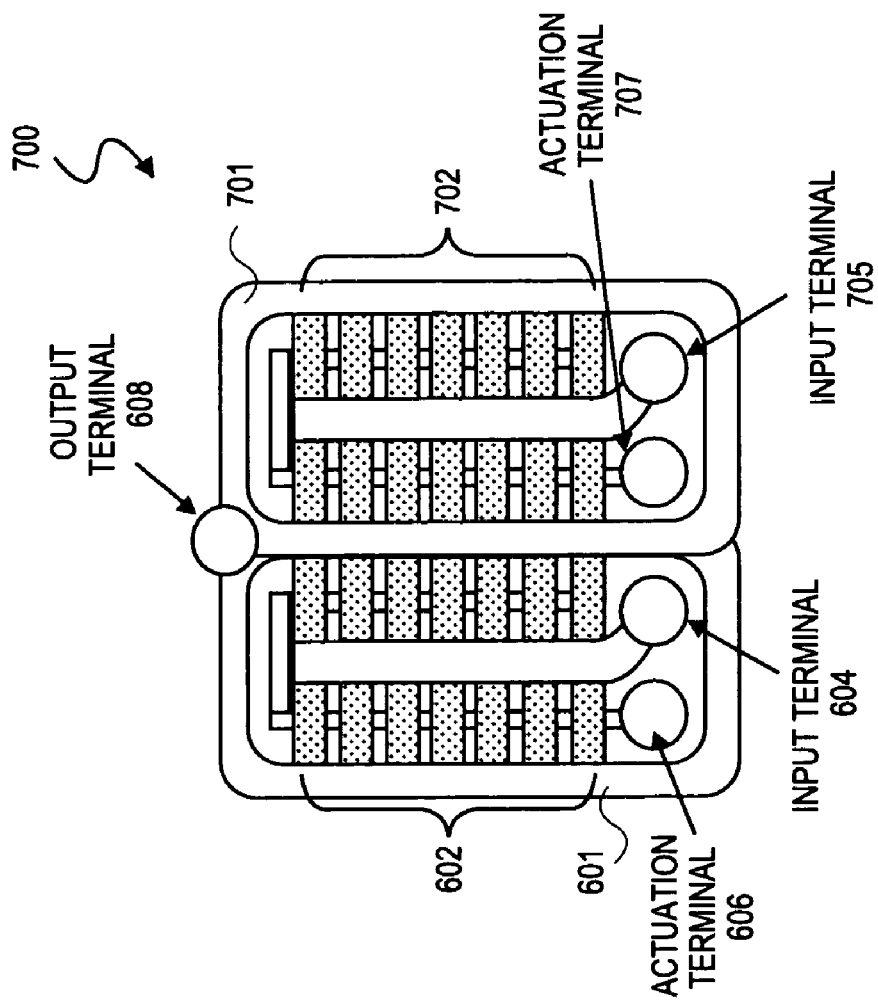
FIG. 7 is a top view diagram illustrating one embodiment of a MEMS RF switch module in accordance with the teachings of the present invention.

MEMS RF switch module 700, shown in FIG. 7, is an alternative embodiment of the present invention. Module 700 includes the elements discussed above in conjunction with module 600. MEMS RF switch module 700 also includes an input terminal 705 electrically coupled to an RF switch array 702 and an actuation terminal 707 electrically coupled to RF switch array 702. MEMS RF switch module 700 includes a trace ring 701 that surrounds the RF switch array 702 and is electrically coupled to the outputs of the RF switch array 702 and output terminal 608.

Figure 8:
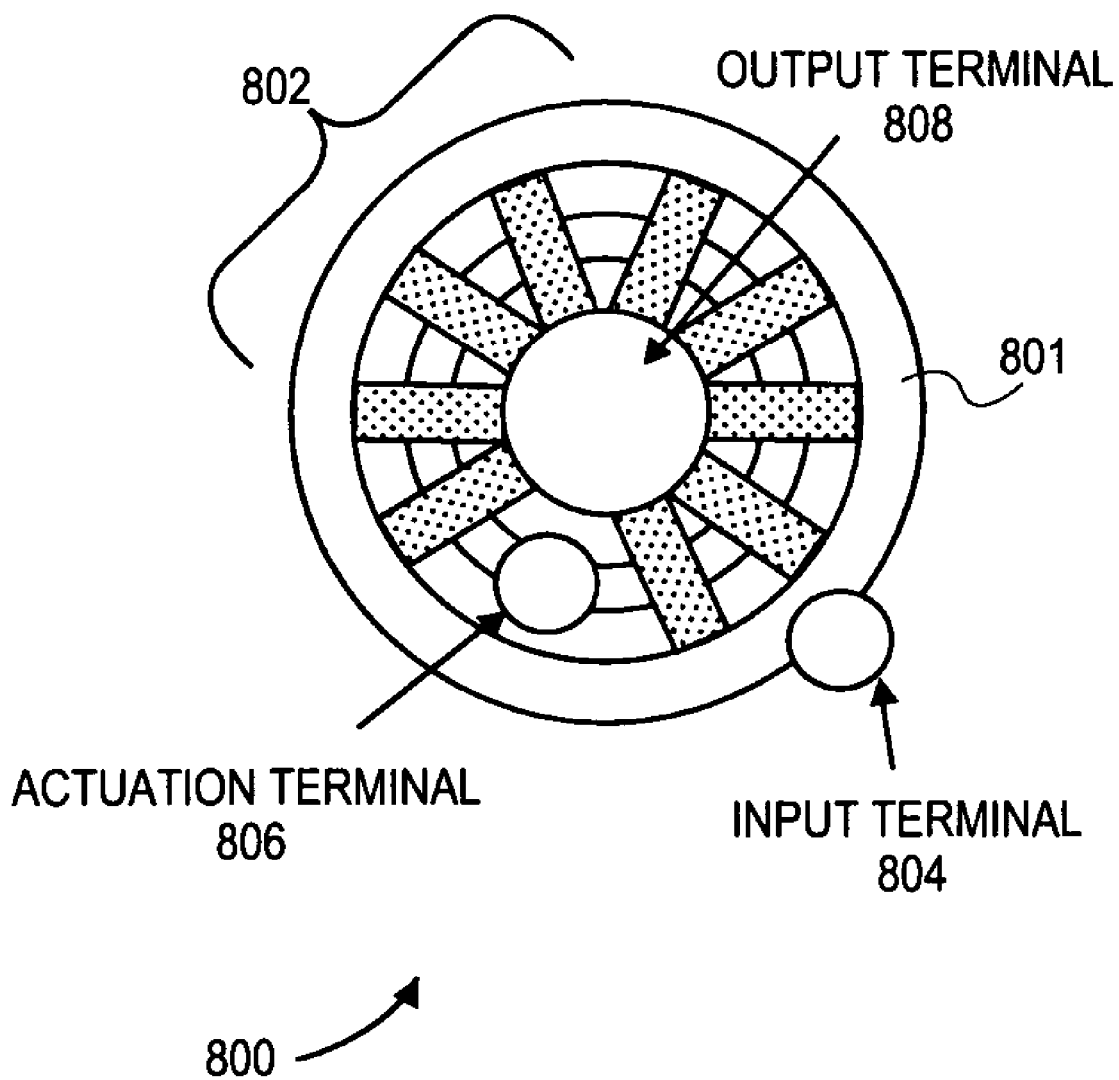
FIG. 8 is a top view diagram illustrating one embodiment of a MEMS RF switch module in accordance with the teachings of the present invention.

Referring to FIG. 8, a top view diagram of a MEMS RF switch module 800 in accordance with one embodiment of the present invention is shown. An input terminal 804 is electrically coupled to the inputs of RF switch array 802 by a trace ring 801 that surrounds the RF switch array 802. The output terminal 808 and an actuation terminal 806 are each electrically coupled to the RF switch array 802. The terminals 804, 806 and 808 are each electrically coupled to vias (not shown) that pass vertically through a cap section (not shown) to route signals vertically between the module 800 and a PCB (not shown.) It should be noted that signals may enter and exit the MEMS RF switch module 800 using terminals 804, 806 and 808 without crossing trace ring 801 because of the vertical via design.

Figure 9:
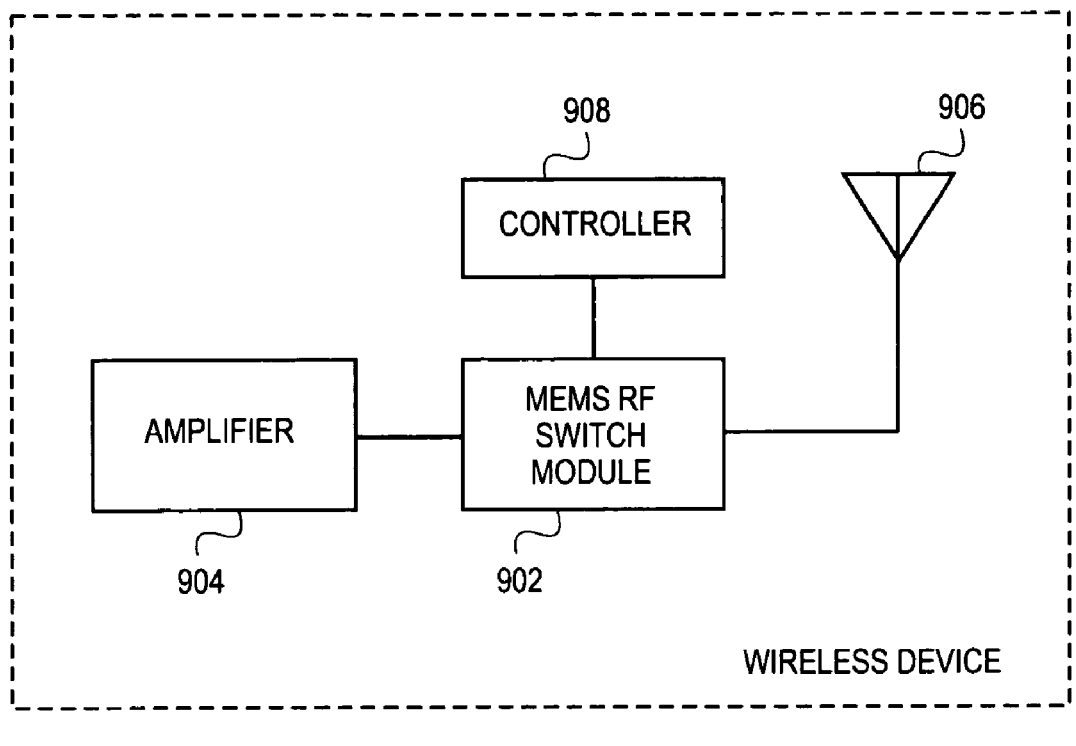
FIG. 9 is a schematic diagram illustrating one embodiment of a wireless device including a MEMS RF switch module in accordance with the teachings of the present invention.

FIG. 9 shows a wireless device 900 in accordance with one embodiment of the present invention. The wireless device 900 includes a MEMS RF switch module 902 electrically coupled to an amplifier 904. An antenna 906 and a controller 908 are also electrically coupled to MEMS RF switch module 902. The RF MEMS switch module 902 includes at least one vertical via as described above.

In one embodiment, an RF signal is inputted into amplifier 904. The RF signal is sent from the amplifier 904 to the MEMS RF switch module 902. The controller 908 inputs an actuation signal to the MEMS RF switch module 902 to actuate the switches of an RF switch array inside the MEMS RF switch module 902. The RF signal is routed through the MEMS RF switch module 902 to the antenna 906 for transmission.

In the foregoing detailed description, the method and apparatus of the present invention have been described with reference to specific exemplary embodiments thereof. It will, however, be evident that various modifications and changes may be made thereto without departing from the broader spirit and scope of the present invention. The present specification and figures are accordingly to be regarded as illustrative rather than restrictive.

What is claimed is:

1. A system, comprising:
a printed circuit board (PCB);
a Micro-electromechanical System (MEMS) Radio Frequency (RF) switch module coupled to the PCB, the MEMS RF switch module comprising:
an RF switch array,
at least one vertical via to electrically couple the RF switch array to the PCB, and
a trace ring to electrically couple the RF switch array to a first vertical via of the at least one vertical via, the trace ring surrounding at least a portion of the RF switch array to allow a signal to transit the MEMS RF switch module using a second vertical via of the at least one vertical via without crossing the trace ring; and
an amplifier electrically coupled to the MEMS RF switch module.

2. The system of claim 1 wherein the system is a wireless device.

3. The system of claim 1 wherein the MEMS RF switch module to switch from a first RF band to a second RF band to transmit an RF signal by the system.

* * * * *